United States Patent [19]
Norris

[11] Patent Number: 5,805,614
[45] Date of Patent: Sep. 8, 1998

[54] FAULT TOLERANT SWITCH FABRIC WITH CONTROL AND DATA CORRECTION BY HAMMING CODES

[75] Inventor: Joseph P. Norris, Mt. Laurel, N.J.

[73] Assignee: General Signal Corporation, Stamford, Conn.

[21] Appl. No.: 675,503

[22] Filed: Jul. 3, 1996

[51] Int. Cl.[6] .................................. H04L 1/00; H04J 3/14
[52] U.S. Cl. ...................................... 371/37.02; 371/37.03
[58] Field of Search .............................. 371/37.02, 37.03

[56] References Cited

U.S. PATENT DOCUMENTS

| | | | |
|---|---|---|---|
| 3,731,275 | 5/1973 | Lenk et al. | 371/52 |
| 4,038,497 | 7/1977 | Collins et al. | 370/361 |
| 4,052,698 | 10/1977 | Ragle | 371/37.6 |
| 4,168,486 | 9/1979 | Legory | 371/37.8 |
| 4,276,647 | 6/1981 | Thacker et al. | 371/39.1 |
| 4,375,664 | 3/1983 | Kim | 395/185.05 |
| 4,438,494 | 3/1984 | Budde et al. | 395/181 |
| 4,491,944 | 1/1985 | Caizergues et al. | 370/387 |
| 4,503,535 | 3/1985 | Budde et al. | 395/184.01 |
| 4,507,782 | 3/1985 | Kunimasa et al. | 371/32 |
| 4,605,928 | 8/1986 | Georgiou | 340/827 |
| 4,654,857 | 3/1987 | Samson et al. | 395/182.03 |
| 4,722,085 | 1/1988 | Flora et al. | 371/40.15 |
| 4,792,948 | 12/1988 | Hangen et al. | 370/376 |
| 4,817,094 | 3/1989 | Lebizay et al. | 371/36 |
| 4,973,956 | 11/1990 | Lin et al. | 340/825.86 |
| 5,027,349 | 6/1991 | Thorne | 370/384 |
| 5,072,217 | 12/1991 | Georgiou et al. | 340/825.79 |
| 5,081,575 | 1/1992 | Hiller et al. | 395/312 |
| 5,105,420 | 4/1992 | Ardon et al. | 370/216 |
| 5,111,462 | 5/1992 | Tarrant | 371/37.6 |
| 5,115,425 | 5/1992 | Ardon | 370/217 |
| 5,131,041 | 7/1992 | Brunner et al. | 370/219 |
| 5,132,975 | 7/1992 | Avaneas | 371/37.6 |
| 5,134,619 | 7/1992 | Henson et al. | 371/40.15 |
| 5,161,156 | 11/1992 | Baum et al. | 395/182.02 |
| 5,170,391 | 12/1992 | Arnold et al. | 370/232 |
| 5,179,550 | 1/1993 | Simpson | 370/380 |
| 5,212,587 | 5/1993 | Healey | 359/301 |
| 5,255,264 | 10/1993 | Cotton et al. | 370/286 |
| 5,282,214 | 1/1994 | Dravida | 371/37.6 |
| 5,291,496 | 3/1994 | Andaleon et al. | 371/3 |
| 5,315,600 | 5/1994 | Iwamura et al. | 371/37.6 |
| 5,327,552 | 7/1994 | Liew | 395/182.02 |
| 5,329,534 | 7/1994 | Cucchi et al. | 371/37.11 |
| 5,331,645 | 7/1994 | Miller et al. | 371/37.12 |
| 5,343,193 | 8/1994 | Shoda et al. | 340/825.79 |
| 5,345,228 | 9/1994 | Franaszek et al. | 340/825.79 |
| 5,371,786 | 12/1994 | Paul | 379/292 |
| 5,377,333 | 12/1994 | Nakagoshi et al. | 395/312 |
| 5,398,239 | 3/1995 | Fedor et al. | 370/380 |
| 5,402,429 | 3/1995 | Stessens | 371/37.07 |
| 5,412,380 | 5/1995 | Matsuda et al. | 340/825.85 |
| 5,425,094 | 6/1995 | Noda | 379/292 |
| 5,455,856 | 10/1995 | Story | 379/327 |
| 5,457,702 | 10/1995 | Williams et al. | 371/37.9 |
| 5,457,740 | 10/1995 | Noda | 379/306 |
| 5,465,260 | 11/1995 | Zook | 371/37.7 |
| 5,488,617 | 1/1996 | Van Driel | 371/37.2 |

*Primary Examiner*—Stephen M. Baker
*Attorney, Agent, or Firm*—Ohlandt, Greeley, Ruggiero & Perle

[57] ABSTRACT

There is provided a dynamic switch organization for error correction of a data path. The dynamic switch organization includes a data path for transmitting data information and control information and a crosspoint switch fabric having a plurality of inputs and a plurality of outputs along the data path. The crosspoint switch fabric has an arbitration bus and crosspoint switch boards coupled to the arbitration bus such that the boards are synchronized to process data in parallel. The crosspoint switch fabric also includes a control entity for directing data from one of the inputs to a particular one of the outputs, and the data includes data bits and check bits. The control entity is distributed among the crosspoint switch boards such that each board includes a portion of the control entity. In addition, the crosspoint switch fabric includes error correction mechanism for applying an error correction scheme, namely a Hamming error correction scheme, to the data and check bits so that the error correction mechanism identifies an erroneous bit and inverts the erroneous bit in order to form corrected data.

23 Claims, 6 Drawing Sheets

PARITY CHECK MATRIX

```
X  X  X  X  X  X           X
X  X  X  X        X  X     X
X  X        X     X  X  X        X
X     X     X  X  X     X           X
―――――――――――――――――――――――――――――――――――
F  E  D  C  B  9  7  6  3  8  4  2  1
```

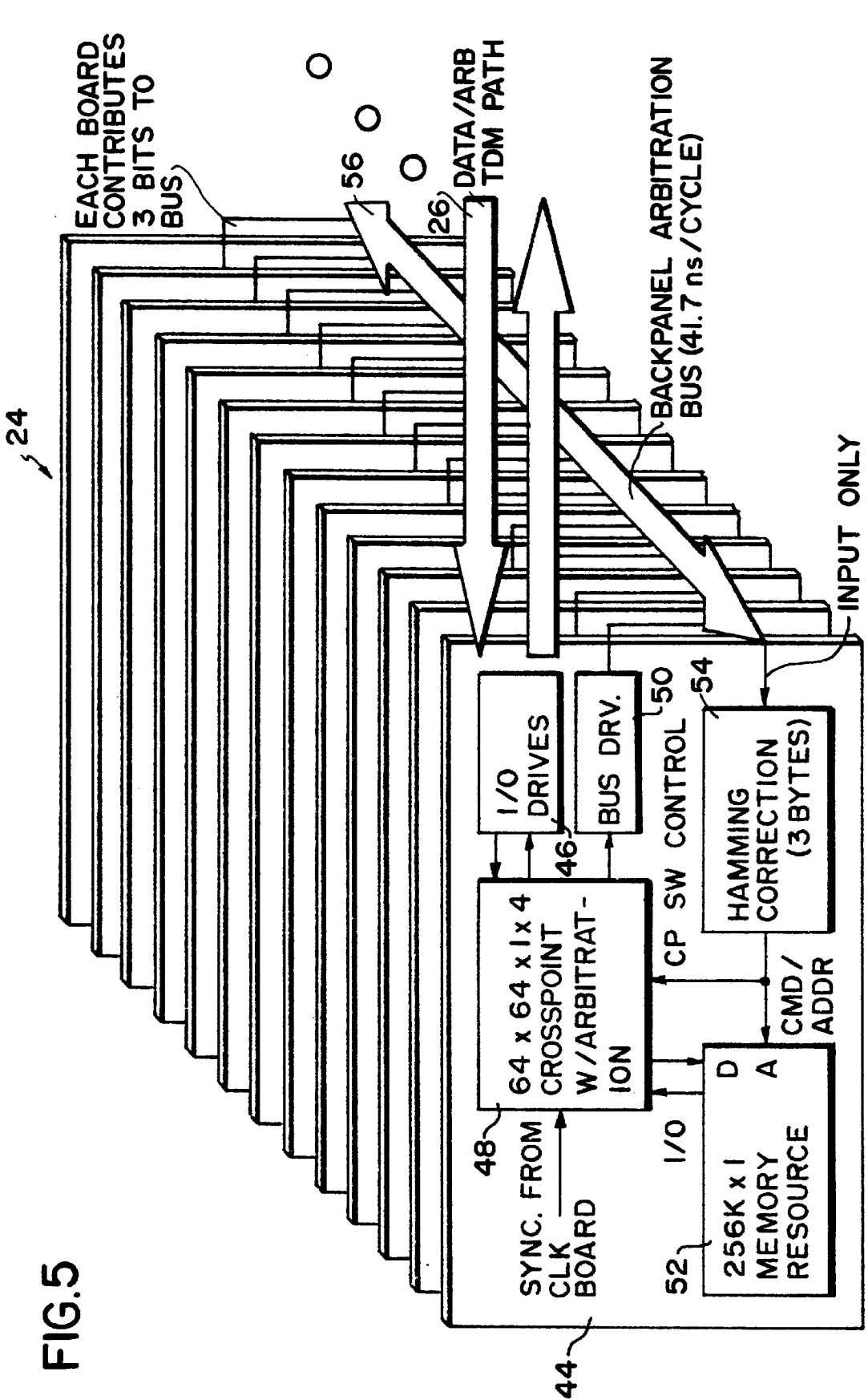

FAULT TOLERANT SWITCH FABRIC WITH CONTROL AND DATA CORRECTION BY HAMMING CODES

The present invention relates generally to crosspoint switches for large scale computer systems having fault tolerant features. More particularly, the present invention relates to a dynamic switch organization for a crosspoint switch that distributes connection control across the data path of the crosspoint switch. The crosspoint switch also includes an error correction scheme for attaining fault tolerance in the crosspoint switch.

RELATED APPLICATIONS

The invention of this application is related to inventions described in three other applications with reference to the same fault tolerant crosspoint switch that are owned by the assignee of the present invention: U.S. patent application Ser. No. 08/674,839 filed on Jul. 3, 1996 entitled FAULT TOLERANT SYNCHRONOUS CLOCK DISTRIBUTION, U.S. patent application Ser. No 08/675,165 filed on Jul. 3, 1996 entitled TIME DIVISION SWITCHING SYSTEM; and U.S. patent application Ser. No 08/675,491 filed on Jul. 3, 1996 entitled FAULT TOLERANT SWITCH FABRIC WITH CONTROL AND DATA CORRECTION BY HAMMING CODES AND ERROR INDUCING CHECK REGISTER.

BACKGROUND OF THE INVENTION

Crosspoint switches are generally used in the computing industry for point-to-point switching between host computer systems and their associated peripherals. Such crosspoint switches are connected to the computer systems and peripherals by various data lines. The crosspoint switch is capable of controlling communication links between the computer systems and peripherals based on certain control signals that are provided by a control entity. Accordingly, proper operation of the control entity is of vital importance to the overall function of the crosspoint switch.

In order to be reliable, a crosspoint switch, including its control entity, should have a fault tolerant architecture since a slight error can have serious consequences for the end users. In other words, a crosspoint switch should not have a single point of system failure that could lead to such consequences. Also, people who rely on the information handled by the crosspoint switch would suffer significant financial losses due to not only malfunctions caused by the inaccurate data but also the inoperability or "down-time" of the crosspoint switch during maintenance and repair. Therefore, a fault tolerant architecture is of high value to the users of the crosspoint switch.

Error correction schemes have been implemented to memory devices in order to create fault-tolerant memory designs. For example, memory devices that use the Reed-Solomon error correction scheme are described in U.S. Pat. No. 5,134,619; to L. P. Henson, which issued on Jul. 28, 1992 and U.S. Pat. No. 5,291,496 to D. D. Andaleon, et al., which issued on Mar. 1, 1994, and memory devices that use the Hamming error correction scheme are described in U.S. Pat. No. 4,276,647 to C. P. Thacker, which issued on Jun. 30, 1981; U.S. Pat. No. 4,438,494 to D. L. Budde, et al., which issued on Mar. 20, 1984; U.S. Pat. No. 5,111,462 to D. R. Tarrant, which issued on May 5, 1992; and U.S. Pat. No. 5,331,645 to M. J. Miller, which issued on Jul. 19, 1994. Although some of the above patents describe switching networks, the error correction scheme is applied to a memory design portion of the switching network, such as a memory buffer or memory storage array, and not the switching network itself.

Error correction schemes, particularly the Hamming error correction scheme, have not been used to create fault tolerant designs for switching networks. For example, U.S. Pat. No. 5,212,587 to P. Healey, which issued on May 18, 1993, describes a binary tree switching network in which switching states are configured to switch signals by means of a control code set based on a Hamming distance. This patent describes the use of a Hamming distance, and not a Hamming correction scheme, with a switching network to provide fault prevention but not fault tolerance. Therefore, none of the above patents, including U.S. Pat. No. 5,212,587, describe or suggest the use of an error correction scheme to provide fault tolerance to a crosspoint switch, particularly the control entity of the crosspoint switch.

In addition, for existing crosspoint switches, the fabric of the crosspoint switch includes a separate control entity to establish connections. Specifically, the control entity is separate from the data network of the crosspoint switch. For a fault tolerant system, such separate control entity must also be made fault tolerant, thus introducing additional levels of complexity. U.S. Pat. No. 4,605,928 to C. J. Georgiou, which issued on Aug. 12, 1986, describes a crosspoint switch having an array of redundant crosspoint matrices to provide fault tolerance. The crosspoint matrices are linked to a controller by a control bus and, thus, the controller is separate from the matrices. Also, the Georgiou patent does not propose the use of error correction codes, particularly Hamming codes, for fault tolerance for the control path.

The control entity may be subdivided so that control of the crosspoint switch is distributed among a plurality of controllers. For example, U.S. Pat. No. 5,072,217 to C. J. Georgiou, et al., which issued on Dec. 10, 1991 and U.S. Pat. No. 5,345,228 to P. A. Franaszek, et al., which issued on Sep. 6, 1994, each describe a crosspoint switch with the functions of the control entity distributed among a plurality of controllers. For U.S. Pat. No. 5,072,217, a port status table tracks the status of the controllers and a system support processor controls the operation of the controllers. In U.S. Pat. No. 5,345,228, a control network, separate from the data network of the crosspoint switch, provides for communication between the controllers. Accordingly, the control entity of existing crosspoint switches, being separate from the data network, requires its own fault tolerant circuit, thus, adding to the complexity and financial cost of manufacturing and maintaining the crosspoint switch. None of these patents describe or suggest the use of error correction codes, particularly Hamming codes, to implement a fault tolerant crosspoint switch data and control path.

Against the foregoing background, it is a primary object of the present invention to provide a dynamic switch organization for a crosspoint switch in which the control entity is distributed throughout the fabric or assembly of the crosspoint switch, namely across the crosspoint switch data path.

It is another object of the present invention to provide such a dynamic switch organization in which a parallel correction scheme, namely a Hamming Correction Scheme, is implemented to attain fault tolerance.

It is a further object of the present invention to provide such a dynamic switch organization in which a fault tolerant control entity is created by forming a fault tolerant fabric via the Hamming Correction Scheme and distributing the control entity across the fabric.

SUMMARY OF THE INVENTION

To accomplish the foregoing objects and advantages, the present invention is a dynamic switch organization for error correction of a data path which, in brief summary, comprises a crosspoint switch fabric having a plurality of inputs and a plurality of outputs. The crosspoint switch fabric or assembly includes control means for directing data from one input of the plurality of inputs to a particular output of the plurality of outputs. In addition, the data includes a plurality of data bits and a plurality of check bits. The crosspoint switch fabric or assembly also includes error correction means for applying an error correction scheme to the data bits and the check bits in which the error correction means is effective to identify an erroneous bit and invert the erroneous bit in order to form corrected data.

The present invention is also a dynamic switch organization having a fault tolerant control entity which comprises a data path for transmitting data information and control information and a crosspoint switch fabric or assembly having a plurality of inputs and a plurality of outputs position along the data path. The crosspoint switch fabric or assembly also includes control means for directing the data information and the control information from one of the plurality of inputs to a particular output of the plurality of outputs.

In addition, the present invention is a dynamic switch organization having a fault tolerant control entity distributed across a data path which comprises a crosspoint switch fabric or assembly having an arbitration bus and a plurality of crosspoint switch boards coupled to the arbitration bus. The crosspoint switch boards are synchronized to process data in parallel such that each of the crosspoint switch boards represents a portion of the data that is transmitted along the data path. In addition, control means is distributed among the crosspoint switch boards in which each of the plurality of crosspoint switch boards includes a portion of the control means. For the present invention, the arbitration bus is a means for communicating connection information to the crosspoint switch fabric assemblies.

BRIEF DESCRIPTION OF THE DRAWINGS

The foregoing and still further objects and advantages of the present invention will be more apparent from the following detailed explanation of the preferred embodiments of the invention in connection with the accompanying drawings:

FIG. 5 is a block diagram of the crosspoint switch boards that form the preferred crosspoint switch fabric of FIG. 1;

DETAILED DESCRIPTION OF THE PREFERRED EMBODIMENT

Figure 1:
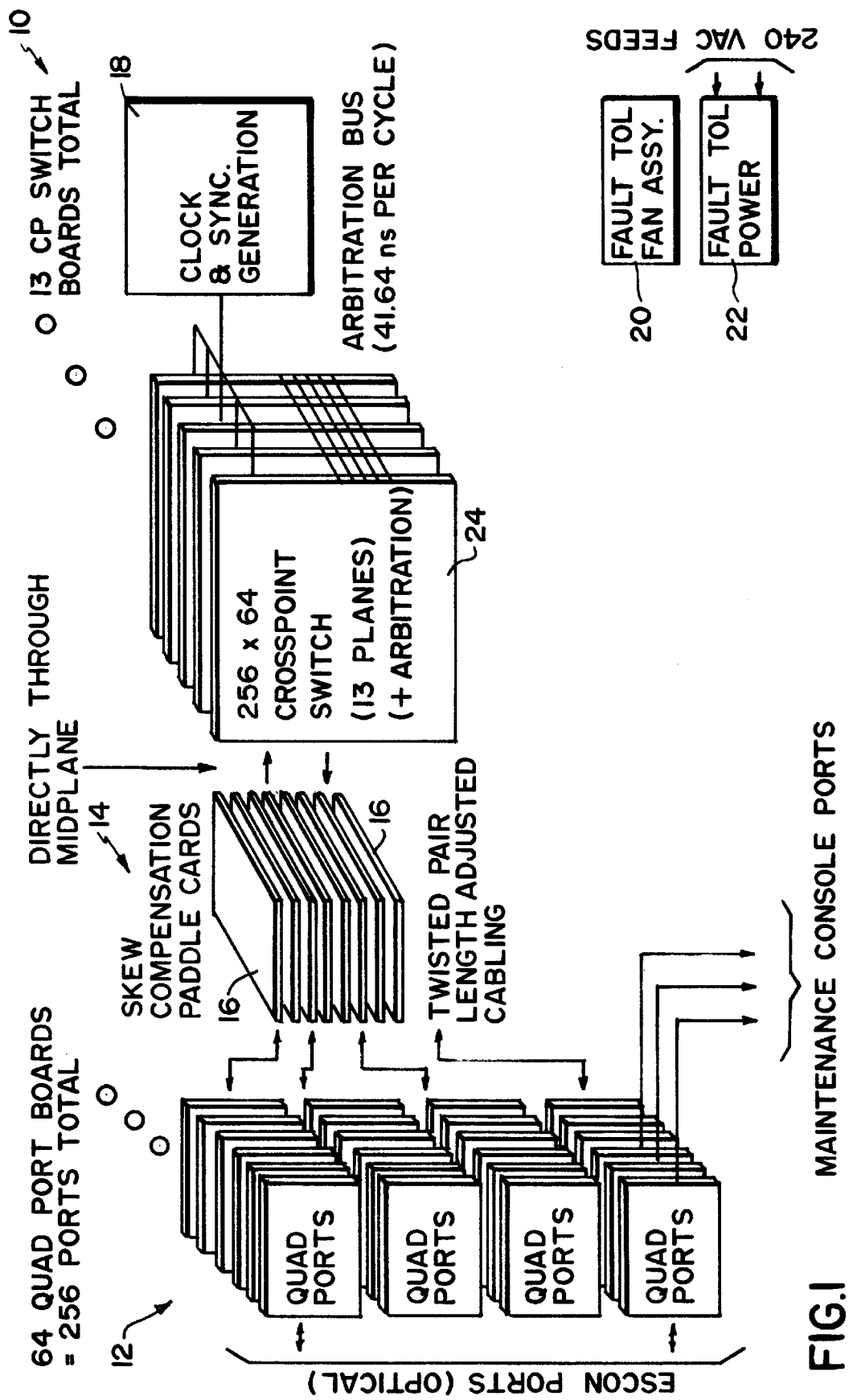
FIG. 1 is a block diagram of a channel director that incorporates the preferred crosspoint switch fabric or assembly of the present invention.

Referring to the drawings and, in particular, to FIG. 1, there is provided a fault tolerant channel director 10 that incorporates the preferred embodiment, namely the preferred crosspoint switch fabric or assembly 24, in accordance with the present invention. The channel director 10 capable of employing any-to-any, point-to-point switching and can make millions of physical connections, dedicated or dynamic, between channels and control units every second. For example, the channel director 10 shown in FIG. 1 is designed for an Enterprise System Connection Architecture ("ESCON") and has 256 optical port capacity to support as many as 125 ESCON connections simultaneously, without contention, when the system is configured as a single unit. The channel director 10 may also be subdivided into two or more sub-directors, each having a proportional number of ports. Also, groups of the ports are time division multiplexed ("TDM") into higher bandwidth parallel paths going to crosspoint switch fabric 24 and, thus, the crosspoint switch fabric is designed to handle TDM data.

In particular, the channel director 10 includes a set of quad port adapters 12, a cable interconnect 14, a centralized clock and sync generator 18, a fault tolerant fan assembly 20 and a fault tolerant power supply 22 in addition to the preferred crosspoint switch fabric or assembly 24. Each of the quad port adapters 12 handles four ESCON ports at 200 Mb/s per port and is interconnected to the cable interconnect 14. The cable interconnect 14 is interconnected between the quad port adapters 12 and the crosspoint switch fabric 24 and uses twisted pair IDC terminated ribbon with skew compensation paddle cards 16. By adjusting their line lengths, the skew compensation paddle cards 16 are used to consolidate the individual bits of a 13-bit byte into a de-skewed collection of data/clock information passing between the quad port adapters 12 and the crosspoint switch fabric 24. The centralized clock and sync generator 18 provides a common clock to all boards of the crosspoint switch fabric 24. Also, consistent with the fault tolerant design of the channel director 10, a redundant scheme is applied for the fan assembly 20 and the power supply 22

As shown in FIG. 1, the preferred crosspoint switch fabric or assembly 24 is a combination crosspoint switch and arbitration fabric that is implemented across a plurality of crosspoint switch planes or boards. Each plane or board represents a single bit within a error correctable byte. For the preferred embodiment, the error correctable byte is a 13-bit byte that includes nine data bits and four check bits and, thus, thirteen crosspoint switch boards are used.

Figure 2:
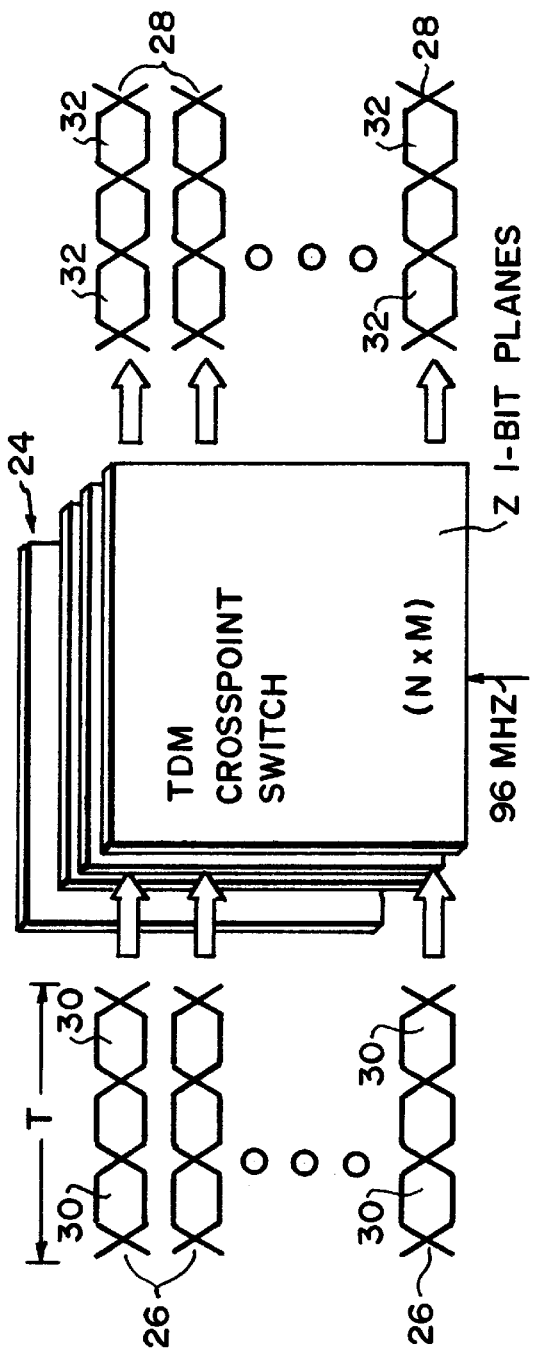
FIG. 2 is a diagrammatic representation of the crosspoint switch boards that form the preferred crosspoint switch fabric of FIG. 1.

Referring to FIG. 2, the crosspoint switch fabric or assembly 24 handles several TDM paths (26, 28) of periodicity T. In FIG. 2, N represents the number of inputs per plane, M represents the number of outputs per plane, Z represents the number of N×M planes and T represents the number of TDM slots. Each TDM (26, 28) path involves a series of time slots (30, 32), and the crosspoint switch fabric 24 is designed so that a slot 30 in any TDM input path 26 can be directed to any slot 32 on any TDM output path 28, thereby effecting (N×T)×(M×T) multiplexing. For the preferred embodiment, a organization of N=64, M=64, Z=13 and T=4 is used to handle the TDM paths (26, 28) into and out of the crosspoint switch fabric 24. In addition a 96 MHz clock is used for each crosspoint switch plane, and a synchronization signal originating from the centralized clock and sync generator 18 goes to each crosspoint switch plane in order to frame the TDM data.

Figure 3:
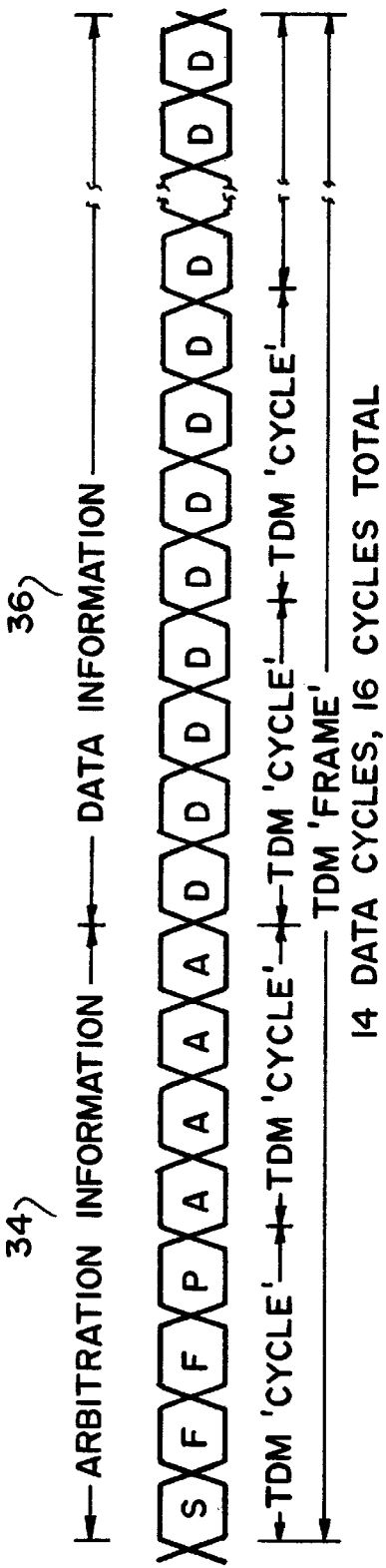
FIG. 3 is a diagrammatic representation of the data and arbitration information that is transmitted along the data path of the preferred crosspoint switch fabric of FIG. 1.

Referring to FIG. 3, the crosspoint switch fabric 24 (shown in FIGS. 1 and 2) uses a single data path to handle both arbitration information 34 and data information 36. The arbitration information 34 provides the control information for the crosspoint switch fabric 24. It is important to note that the arbitration information 34 shares the same data path as the data information 36 and, thus, any error correction scheme that is applied to this data path provides fault tolerant properties for both arbitration and data information.

As shown in FIG. 3, the arbitration information 34 includes a synchronization byte S, a message validity byte F, an invert of the message validity byte F', arbitration bytes A and longitudinal parity check P for the arbitration bytes. The invert of the message validity byte F' is used to minimize the chance of false messages, and the longitudinal parity check P is used as a message integrity check. For the preferred embodiment, each TDM frame incorporates a total of sixteen TDM cycles in which two cycles are used for sync/messages while the other fourteen cycles are used for data.

Figures 4A, 4B:
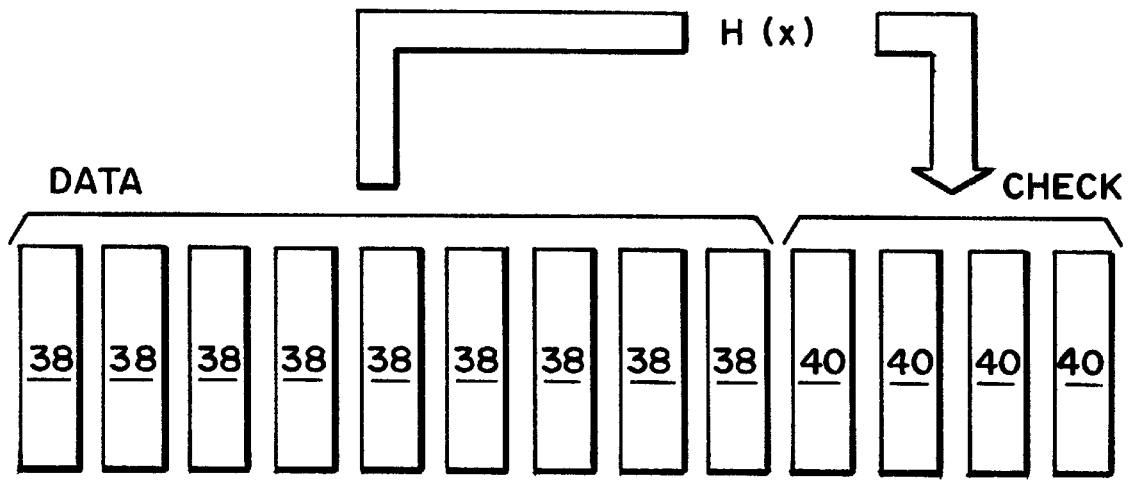
FIGS. 4A and 4B are a diagrammatic representations of the Hamming error correction scheme that is applied to the data and arbitration information of FIG. 3.

Referring to FIGS. 4A and 4B, an error correction scheme is employed in the crosspoint switch fabric 24 (shown in FIGS. 1 and 2) to permit servicing, specifically live removal and insertion, of its planes or boards without having to bring down the channel director 10. An error correction code, preferably a Hamming code, is used to achieve fault tolerance for the data paths going to and coming from the crosspoint switch fabric 24 (shown in FIGS. 1 and 2). The crosspoint switch fabric 24 is divided into a plurality of crosspoint switch planes or boards. For the preferred embodiment, each crosspoint switch board represents a 1-bit wide plane out of the 13-bit wide data/correction path. Failure or removal of any one of these planes will be corrected, and will not disrupt the continuity of the data between source and target ports.

As shown in FIG. 4A, the data path of the channel director 10, including the crosspoint switch fabric 24, conveys nine data bits 38 and four check bits 40, thus forming a thirteen bit parallel data path. The parity check matrix of the Hamming code is shown in FIG. 4B. Generally, the X-bit wide data information, represented by data bits (38) $2^0$ through $2^{(x-1)}$, are appended with an additional Y bits of check bit information, represented by check bits 40. For single bit error correction, the Hamming technique requires $2^Y > (X+Y)$ so that enough additional bits are appended to insure that intersections in a parity check matrix 42, as shown in FIG. 4B, are able to uniquely identify a bit in error. A result of zero by the parity check matrix 42 indicates that no error exists, and a result of "A" or "5" indicates a multi-bit error. For all other results, the identified bit is inverted to form the corrected data. Also, additional check bits 40 may be included to enable multiple bit error detection and multiple-bit error correction.

A single bit failure in the data path is corrected by hardware at the recipient port of the crosspoint switch fabric 24. Thus, if there is any failure in one of the bits within the crosspoint switch fabric 24, the recipient is able to correct the error. Moreover, the Hamming correction syndrome, i.e. the result of the parity check matrix 42, will point to the failing bit, thereby localizing the failing hardware component.

One feature of the present invention is to provide a fault tolerant control entity for the crosspoint switch fabric 24. As stated above, the data path of the crosspoint switch fabric 24 has been made fault tolerant by applying an error correction scheme, namely the Hamming error correction scheme. Since the control or arbitration information of the present invention shares the same data path as the data information, the error correction scheme provides fault tolerant properties for both arbitration and data information. Accordingly, the control entity for the crosspoint switch fabric 24, particularly its arbitration information, is fault tolerant.

Referring to FIG. 5, the crosspoint switch fabric 24 of the preferred embodiment is implemented with a total of thirteen boards. Each board 44 represents a single bit within an error correctable 13-bit byte. Each board 44 comprises an I/O driver circuit 46, a crosspoint switch circuit 48, a bus driver circuit 50, a memory resource 52 and a Hamming correction circuit 54. The I/O driver circuit 46 provides an interface between the TDM input and output paths (26, 28) and the crosspoint switch circuit 48. Also, the crosspoint switch circuit sends information to the backpanel arbitration or midplane bus 56 through the bus driver circuit 50 and receives information from the midplane bus that has been processed by the Hamming correction circuit 54. In addition, the memory resource 52 is 256Kbit static RAM that is used primarily as the control unit processor resource memory, but may have other applications are required by the firmware, such as mailboxes. The collection of thirteen of these 256Kbit RAMs found across the thirteen crosspoint switch boards 44 form a 256Kbyte Hamming-corrected memory resource available to all the quad port adapters (shown in FIG. 1).

Each crosspoint switch board 44 obtains their respective arbitration message bits according to the timing dictated by the Sync signal received from the centralized clock and sync generator 18 (shown in FIG. 1). Three bits from each crosspoint switch circuit 48 contributes to their respective bits on a 3-byte error correctable midplane bus 56 in which there are thirteen bits per byte. The entire 3-byte midplane bus 56 is seen simultaneously and synchronously by all crosspoint switch boards 44, and each crosspoint switch board performs a Hamming error correction to recover the corrected data from the midplane bus 56. Thus, one of the thirteen crosspoint switch boards 44 may be operating improperly or missing, but the remaining twelve boards will still be able to recover the correct data from the midplane bus 56.

As stated above, the channel director 10 (shown in FIG. 1), particularly the crosspoint switch fabric 24, employs an error correction scheme in order to provide a fault tolerant data path through the switching fabric. The location of this logic is in the Hamming correction circuit 54 shown in FIG. 5. It is to be understood that this Hamming correction circuit 54 is used on the quad port adapters 12 as well as the crosspoint switch fabric 24 and any other part of the channel director 10 that may require a fault tolerant data path.

Figure 6:
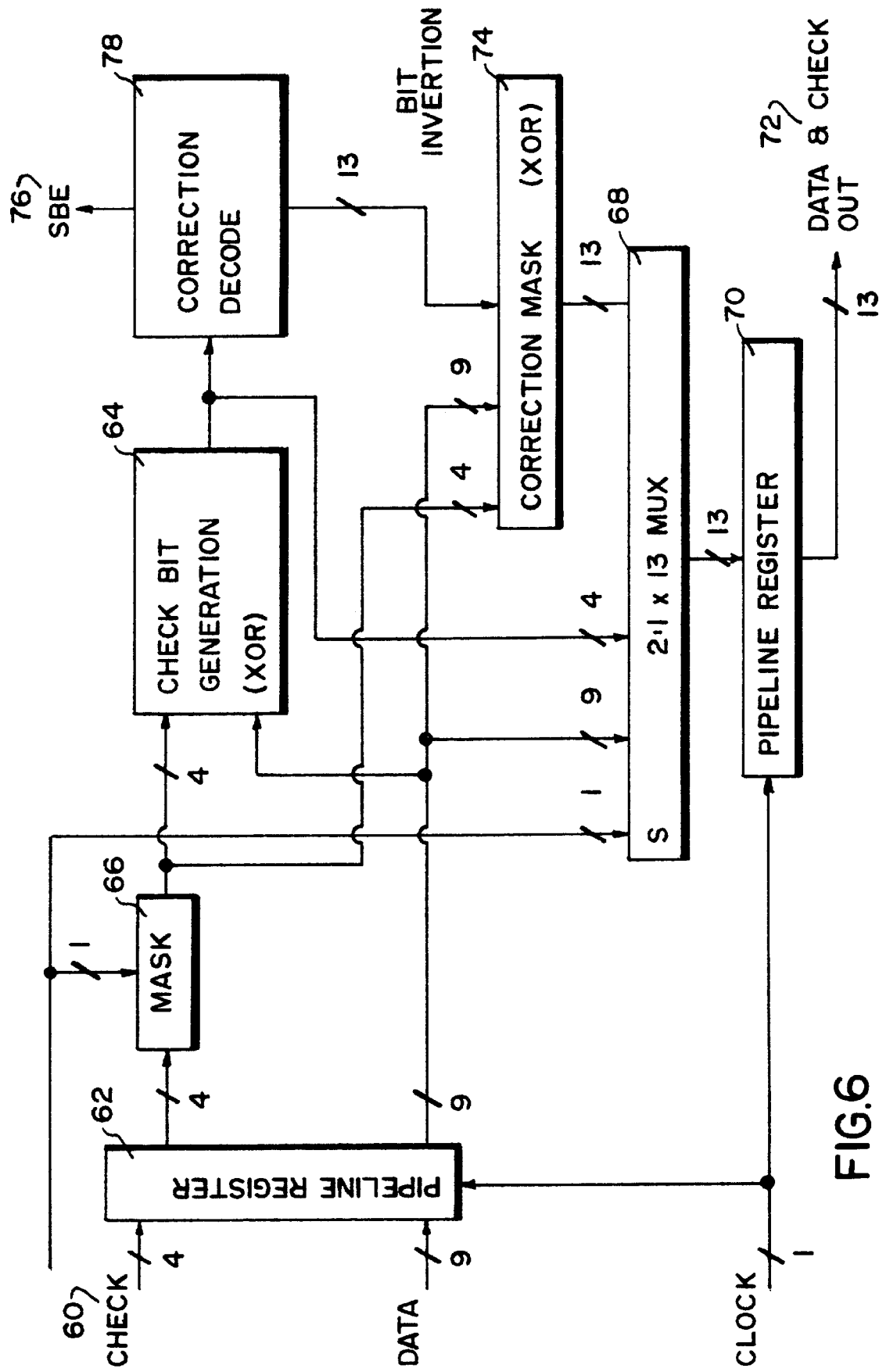
FIG. 6 is a block diagram of the Hamming correction register of FIG. 5.

Referring to FIG. 6, there is shown one possible implementation for the Hamming correction circuit 54 shown in FIG. 5. To generate the Hamming code, nine data bits 58 and their corresponding four check bits 60 enter the a pipeline register 62 and pass to a check bit generation parity matrix 64. For Hamming check bit generation, the check bits 60 are masked off to zeros by a mask function 66 before reaching the parity matrix 64. The data bits 58 and the output of the parity matrix 64 pass through a multiplexer 68 and another pipeline register 70 which eventually drives out thirteen bits of data 72.

For Hamming correction, the nine data bits 58 and four check bits 60 pass through the same check bit generation parity matrix 64 to produce a 4-bit syndrome. If the syndrome is zero, then nothing needs to be corrected. However, if the syndrome is non-zero, then the appropriate bit is inverted by a correction mask 74 in order to perform the correction, and a single bit error ("SBE") 76 is generated by a correction decoder 78 to inform a maintenance entity (not shown) of the system.

Figure 7:
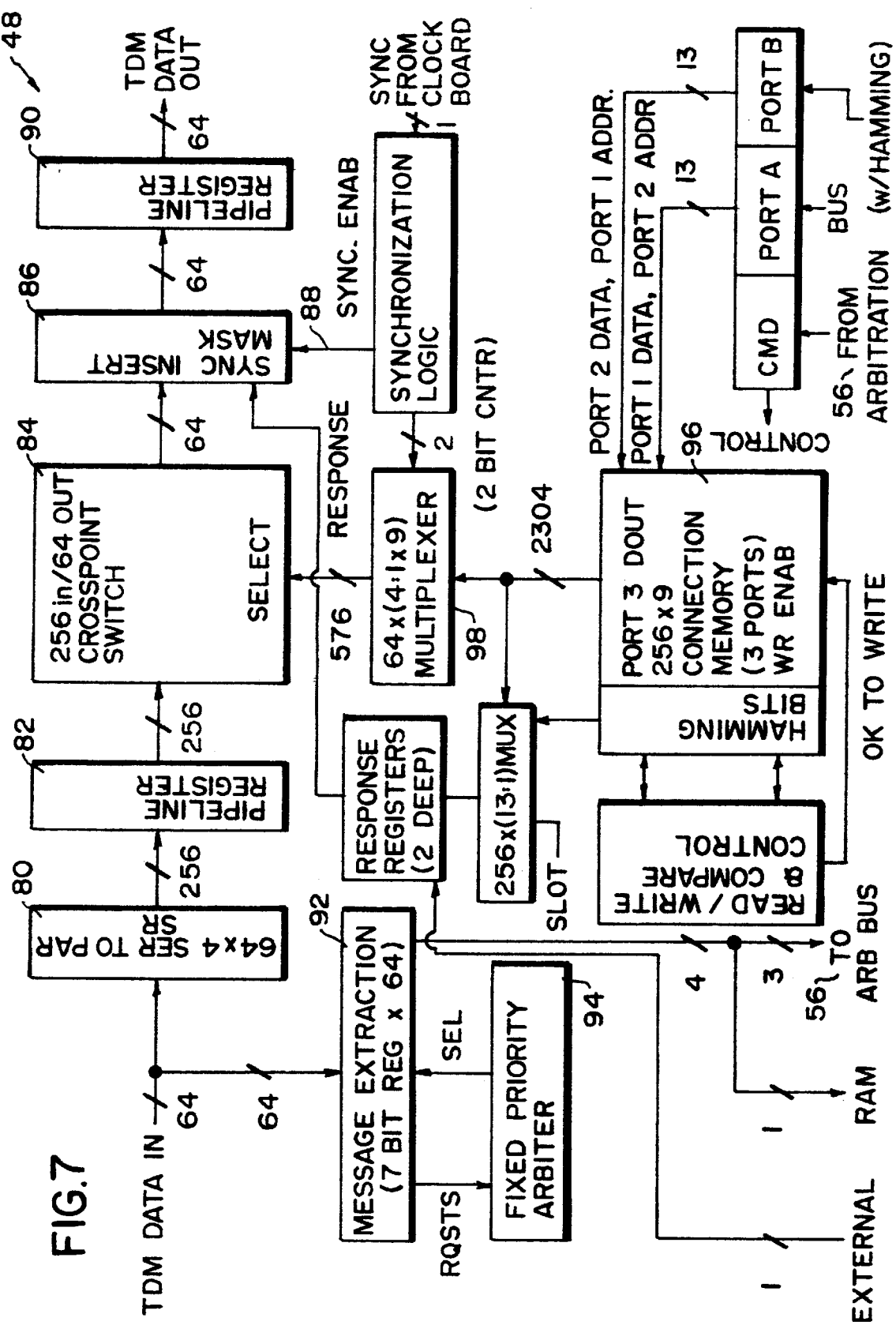
FIG. 7 is a block diagram of the crosspoint switch circuit of FIG. 5.

Referring to FIG. 7, there is shown a preferred embodiment of the crosspoint switch circuit 48 shown in FIG. 5.

This corresponds essentially with the embodiment shown in FIG. 1 of copending U.S. patent application No. [not yet assigned] filed on Jun. 28, 1996 cited above. The data path of the crosspoint switch circuit 48 initially converts incoming TDM data into a parallel equivalent. Specifically, a sixty-four, 4-bit serial input is processed through parallel output shift registers 80. The output of the shift registers 82 is synchronously sampled by a pipeline register 82 and, then, processed through a 256 in/64 out non-blocking crosspoint switch 84. The crosspoint switch 84 may be pipelined, dependent upon the speeds involved. A sync insert mask 86 is used to force the sync pattern into the IDM output stream at the precise time indicated by the sync signal 88 originating from the centralized clock and sync generator 18 (shown in FIG. 1). As stated above, each crosspoint switch board 44 handles only 1 bit of the sync pattern, so the sync insert mask 86 must force all 1's or all 0's in the TDM output data stream depending on the slot number associated with the respective crosspoint switch board. An output pipeline register 90 is then used to convey the TDM data to the logic outside the crosspoint switch circuit 48.

Message extraction registers 92 are used to pick off messages following the sync indicator. The F bits (shown in FIG. 3) indicate whether the message is valid or not, and the message validity becomes a request input to a 64-channel fixed priority arbiter 94. The arbiter 94 selects the next message that should be presented on the backpanel arbitration or midplane bus 56 (shown in FIG. 5), and the F bits are reset to indicate that the selected message has been sent over the midplane bus. Only a few selected bits of the arbitration messages are selected, and the complete message is consolidated on the midplane bus 56, which is visible to all crosspoint switch boards 44.

Control signals of the crosspoint switch circuit 48 are held by the connection memory 96 which is connected to the backpanel arbitration or midplane bus 56. A 4:1 multiplexer 98 connected to the connection memory 96 is used to convert the 256 channels of parallel data received from pipeline register 82 back into its TDM equivalent at output from pipeline register 90, the select input to 4:1 multiplexer 98 being changed at the data rate at the output of pipeline register 90. In addition, the connection memory 96 is refreshed when a crosspoint switch board 44 connected to the midplane bus 56, such as when a new board is installed. In such event, special refresh arbitration messages may be used to accomplish the re-alignment of a newly installed board.

The present invention having been thus described with particular reference to the preferred forms thereof, it will be obvious that various changes and modifications may be made therein without departing from the spirit and scope of the invention as defined in the appended claims.

What is claimed is:

1. A dynamic switch organization for error correction of a data path comprising:
   a crosspoint switch fabric having a plurality of inputs and a plurality of outputs, said crosspoint switch fabric including control means for directing data from one of said plurality of inputs to a particular output of said plurality of outputs, said data including a plurality of data bits and a plurality of check bits; and
   said crosspoint switch fabric including error correction means for applying an error correction scheme to said plurality of data bits and said plurality of check bits, said error correction means being effective to identify an erroneous bit and invert said erroneous bit in order to form corrected data.

2. The dynamic switch organization of claim 1, wherein said error correction scheme is a Hamming error correction scheme.

3. The dynamic switch organization of claim 1, wherein said plurality of data bits and said plurality of check bits satisfy the following equation:

$$2^Y > (X) + Y$$

in which X is the number of data bits and Y is the number of check bits.

4. The dynamic switch organization of claim 3, wherein said plurality of data bits includes nine data bits, and said plurality of check bits includes four check bits.

5. The dynamic switch organization of claim 1, wherein each of said data information and said control information includes a plurality of data bits and a plurality of check bits that satisfy the following equation:

$$2^Y > (X+Y)$$

in which X is the number of data bits and Y is the number of check bits.

6. The dynamic switch organization of claim 5, wherein said plurality of data bits includes nine data bits, and said plurality of check bits includes four check bits.

7. A dynamic switch organization having a fault tolerant control entity comprising:
   a data path for transmitting data information and control information; and
   a crosspoint switch fabric having a plurality of inputs and a plurality of outputs position along said data path, said crosspoint switch fabric including control means for directing said data information and said control information from one of said plurality of inputs to a particular output of said plurality of outputs.

8. The dynamic switch organization of claim 7, wherein said control means is distributed across said data path.

9. The dynamic switch organization of claim 7, wherein said data path transmits parallel data bits, and said control information is transmitted in parallel along said data path.

10. The dynamic switch organization of claim 7, wherein said crosspoint switch fabric includes error correction means for applying an error correction scheme to said data information and said control information.

11. The dynamic switch organization of claim 10, wherein said error correction scheme is a Hamming error correction scheme.

12. A dynamic switch organization having a fault tolerant control entity distributed across a data path comprising:
   a crosspoint switch fabric having an arbitration bus and a plurality of crosspoint switch boards coupled to said arbitration bus, said crosspoint switch boards being synchronized to process data in parallel, each of said crosspoint switch boards representing a portion of said data that is transmitted along the data path; and
   control means distributed among said crosspoint switch boards, wherein each of said plurality of crosspoint switch boards includes a portion of said control means.

13. The dynamic switch organization of claim 12, wherein said portion of said data is one data bit.

14. The dynamic switch organization of claim 12, wherein each of said crosspoint switch boards includes means of correcting an erroneous data bit caused by another one of said crosspoint switch boards.

15. The dynamic switch organization of claim 12, further comprising error correction means distributed among said crosspoint switch boards, wherein each of said plurality of crosspoint switch boards includes a portion of said error correction means, and said error correction means applies an error correction scheme to said data.

16. The dynamic switch organization of claim 15, wherein each of said portion of said error correction means includes means for obtaining said data from said arbitration bus and means for providing said portion of said data represented by said respective crosspoint switch board.

17. The dynamic switch organization of claim 15, wherein said error correction scheme is a Hamming error correction scheme.

18. The dynamic switch organization of claim 12, wherein said data includes a plurality of data bits and a plurality of check bits that satisfy the following equation:

$$2^Y > (X+Y)$$

in which X is the number of data bits and Y is the number of check bits.

19. The dynamic switch organization of claim 18, wherein said plurality of data bits includes nine data bits, and said plurality of check bits includes four check bits.

20. The dynamic switch organization of claim 12, wherein said data includes at least one arbitration message byte.

21. The dynamic switch organization of claim 20, wherein each of said crosspoint switch boards provides one data bit from each arbitration message byte of said data to collectively form backplane information on said arbitration bus.

22. The dynamic switch organization of claim 21, wherein said backplane information is in the form of three byte error correcting data.

23. The dynamic switch organization of claim 21, wherein each of said crosspoint switch boards receives and corrects said backplane information, and uses said backplane information to provide addressibility of said crosspoint switch fabric.

* * * * *